(12) United States Patent
Kim et al.

(10) Patent No.: US 6,569,750 B2
(45) Date of Patent: May 27, 2003

(54) METHOD FOR FORMING DEVICE ISOLATION FILM FOR SEMICONDUCTOR DEVICE

(75) Inventors: Young Seok Kim, Kyoungki-do (KR); Jae Goan Jeong, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 15 days.

(21) Appl. No.: 09/751,450

(22) Filed: Jan. 2, 2001

(65) Prior Publication Data

US 2001/0016397 A1 Aug. 23, 2001

(30) Foreign Application Priority Data

Dec. 30, 1999 (KR) .......................... 1999-66575

(51) Int. Cl.⁷ .................... H01L 21/425; H01L 21/76
(52) U.S. Cl. .................... 438/524; 438/424; 438/433
(58) Field of Search ................... 438/524, 424, 438/296, 433, 401

(56) References Cited

U.S. PATENT DOCUMENTS

| 5,904,538 A | * | 5/1999 | Son et al. |
| 5,943,585 A | * | 8/1999 | May et al. |
| 6,001,707 A | * | 12/1999 | Lin et al. |
| 6,030,882 A | * | 2/2000 | Hong |
| 6,165,871 A | * | 12/2000 | Lim et al. |
| 6,300,655 B1 | * | 10/2001 | Ema et al. |

FOREIGN PATENT DOCUMENTS

JP    60-140754    7/1985

* cited by examiner

Primary Examiner—John F. Niebling
Assistant Examiner—Stanetta Isaac
(74) Attorney, Agent, or Firm—Pillsbury Winthrop LLP

(57) ABSTRACT

The present invention discloses a method for forming a device trench isolation film for a semiconductor device having impurity regions at the sidewalls of the trench. The impurity regions increase the threshold voltage of the transistor and suppress an inverse narrow width effects. In addition, the method prevents or suppresses the phenomenon wherein an impurity in a channel region moves to the trench and lowers the threshold voltage of the transistor, decreases the leakage current, and overcomes a hump phenomenon by turning on a parasitic transistor at the sidewalls with the transistor in the active region. As a result, the electrical properties and reliability of the resulting semiconductor device are improved.

6 Claims, 4 Drawing Sheets

METHOD FOR FORMING DEVICE ISOLATION FILM FOR SEMICONDUCTOR DEVICE

BACKGROUND OF THE INVENTION

1. Field of the Invention

The present invention relates to a method for forming a device isolation film for a semiconductor device and, in particular, to an improved method for forming a device isolation film that can prevent degradation of a gate electrode formed at the intersection of the trench type device isolation film and an active region in a subsequent process. The improved method provides for forming an impurity region at the side walls of a trench by ion-implanting an impurity into a semiconductor substrate at both sides of the trench.

2. Description of the Background Art

In order to improve the degree of integration of a device, it is generally necessary to reduce the dimensions of each component in a device and the width and area of the device isolation regions that separate the devices. The device isolation region occupies a large area in a memory cell. Accordingly, the reduction of the size of the memory cell depends on the degree to which the size of the device isolation region can be reduced.

Methods for forming device isolation films have included the local oxidation of silicon (LOCOS), the poly-buffed LOCOS (PBL) method which involves sequentially stacking an oxide film, a polysilicon layer and a nitride film on a silicon substrate, and the trench method which involves forming a groove in the substrate and filling the groove with an insulating material.

FIGS. 1a and 1b are cross-sectional diagrams illustrating sequential steps of a conventional method for forming a trench type device isolation film for a semiconductor device.

As illustrated in FIG. 1a, a pad oxide film 13 and a pad nitride film 15 are formed on a semiconductor substrate 11 at a predetermined thickness.

The pad nitride film 15, the pad oxide film 13 and a predetermined thickness of the semiconductor substrate 11 are then etched according to a photolithography process using a device isolation mask (not shown), thereby forming a trench 17.

The trench 17 is then filled with an oxide film 19. The oxide film 19 is initially formed over the entire structure, and then planarized, preferably using a CMP process.

As depicted in FIG. 1b, after the device isolation oxide film is formed, the pad nitride film 15 and the pad oxide film 13 are removed. A well (not shown) is then formed by ion-implanting an impurity into the semiconductor substrate 11.

A gate oxide film 21 is then formed on the surface of the semiconductor substrate 11 in the active regions. A gate electrode is then formed on the gate oxide film 21, in this instance having a stacked structure with layers of a doped polysilicon 23 and a tungsten silicide 25.

The gate electrode is also formed on the device isolation film, i.e. the non-active region at the same time it is formed in the active region. Furthermore, a moat is formed between the active region and the non-active region.

The indicated regions (a) denote a portion where an inverse narrow width effect is generated due to a decreased dopant concentration.

Referring to FIGS. 2 and 3, the device isolation film shows how the inverse narrow width effect decreases the channel width and thus reduces the threshold voltage.

In this case, the dopant in the channel region has moved to the trench, thereby causing the inverse narrow width effect. The channel concentration can be increased to overcome this disadvantage. However, the increased channel doping, however also increases the leakage current, thereby degrading the a refresh properties of the resulting device.

In addition, the gate electrode formed at the upper portion of the moat of the trench tends to have a reduced thickness, as compared with the general active region, and thus the threshold voltage is decreased.

As described above, the inverse narrow width effect decreases the threshold voltage of the transistor, increases the leakage current of the cell, and thus degrades the refresh properties. On the other hand, as dopant moves to the trench, the accumulation causes a short channel hump phenomenon at the trench. That is, a parasitic transistor is created at the sidewalls of the trench, thereby increasing the offstate leakage current.

As a result, the conventional method for forming the device isolation film for the semiconductor device generates the inverse narrow width effect, thereby increasing the leakage current of the device and degrading the device refresh properties thereof. Thus, the performance and reliability of the resulting semiconductor devices are weakened.

SUMMARY OF THE INVENTION

Accordingly, an object of the present invention is to provide a method for forming a device isolation film for a semiconductor device which can prevent degradation devices properties and improve reliability of the resulting semiconductor devices, with an impurity implantation region. This impurity implantation region is formed by ion-implanting an impurity into the semiconductor substrate at both sides of the intended trench location before the trench etching process.

In order to achieve the above-described object a method is provided for forming a device isolation film for a semi-conductor device, including the steps of: sequentially forming a pad oxide film and a pad nitride film on a semiconductor substrate; forming a pad oxide film pattern and a pad nitride film pattern, by patterning and etching the pad oxide film and the pad nitride film using a device isolation mask; forming an impurity implantation region by ion-implanting an impurity into the semiconductor substrate using the pad nitride film pattern as a mask, and by diffusing the implanted impurity with a thermal treatment; forming a trench by etching the semiconductor substrate again using the pad nitride film pattern as a mask, the impurity implantation region being provided at the sidewalls of the trench; forming a device isolation film filling the trench, and removing the pad nitride and pad oxide; and forming a gate electrode on the device isolation film and active region, the impurity implantation region being located in the semiconductor for substrate beneath at least a portion of the gate electrode.

BRIEF DESCRIPTION OF THE DRAWINGS

The present invention will become better understood with reference to the accompanying figures which are given only by way of illustration and thus are not intended of the present invention, wherein.

DETAILED DESCRIPTION OF THE PREFERRED EMBODIMENTS

A method for forming a trench type device isolation film for a semiconductor device in accordance with the present invention will now be described with reference to the accompanying figures.

Figure 1A:
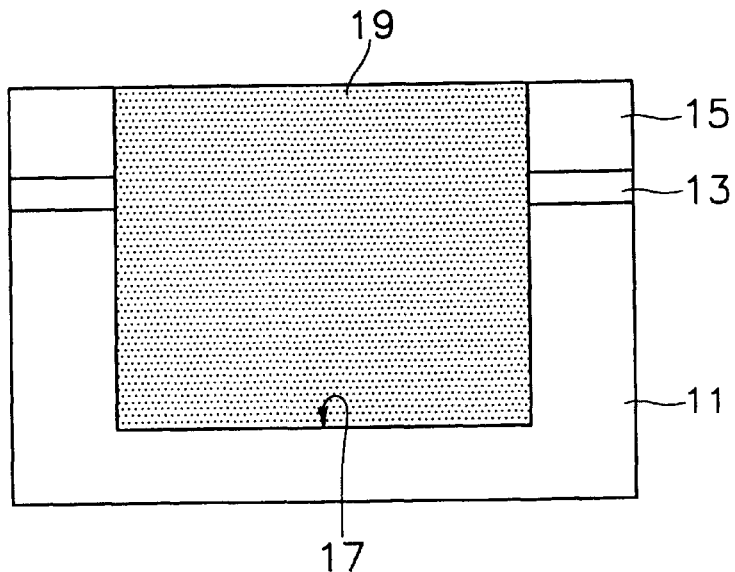
FIGS. 1a and 1b are cross-sectional diagrams illustrating the sequential steps of a conventional method for forming a device isolation film for a semiconductor device.
Figure 1B:
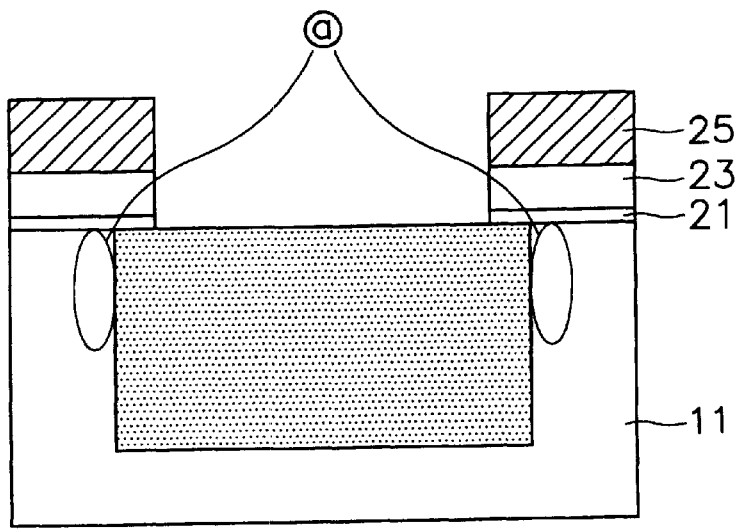
Figure 2:
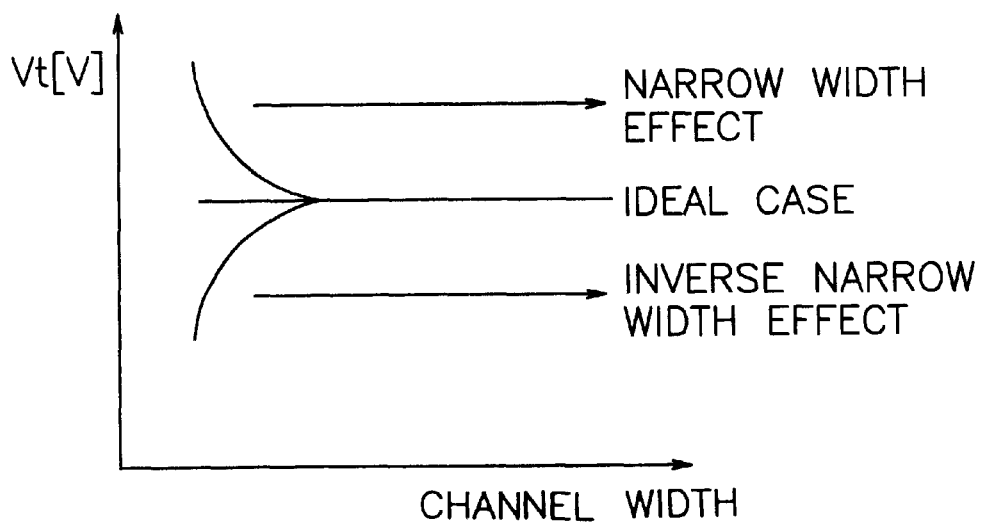
FIG. 2 is a graph showing variations of a threshold voltage according to a channel width.
Figure 3:
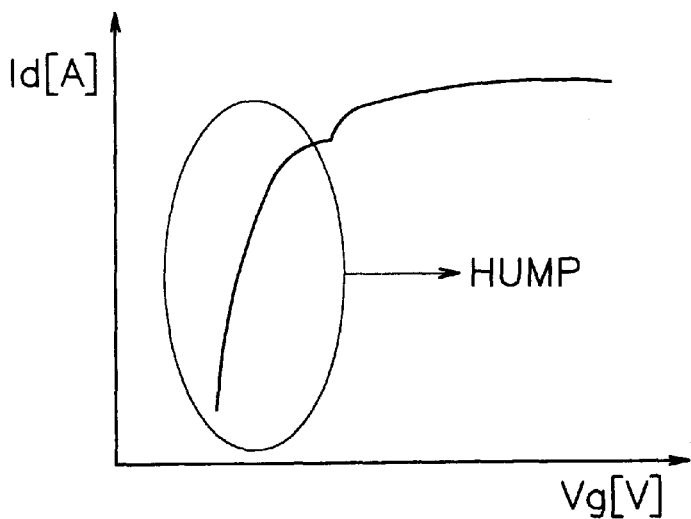
FIG. 3 is a graph showing a drain current as a function of gate voltage for a device formed using the conventional method of forming the isolation film.
Figure 4A:
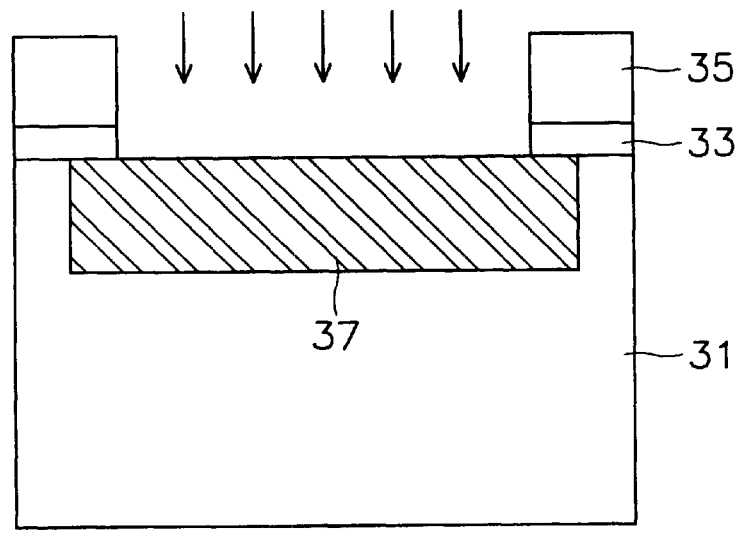
FIGS. 4a to 4c are cross-sectional diagrams illustrating the sequential steps for forming an isolation film for a semiconductor device according to the present invention.

As illustrated in FIG. 4a, a pad oxide film 33 and a pad nitride film 35 having a predetermined thickness are formed on a semiconductor substrate 31.

The pad nitride film 35 and the pad oxide film 33 are patterned and etched using conventional a photolithography and etch processes to expose the region of the substrate on which the device isolation film will be formed.

Boron ions are then ion-implanted into the device isolation region of the semiconductor substrate 31 using the stacked structure of the pad nitride and pad oxide as a mask. The boron is then diffused under the peripheral portion of the stacked structure using to a thermal treatment to form impurity implantation region 37.

The impurity ion implantation process is preferably performed at an energy of 10 to 100 KeV.

The impurity implantation region 37 may be formed by using an opposite type impurity to boron, such as arsenic.

Figure 4B:
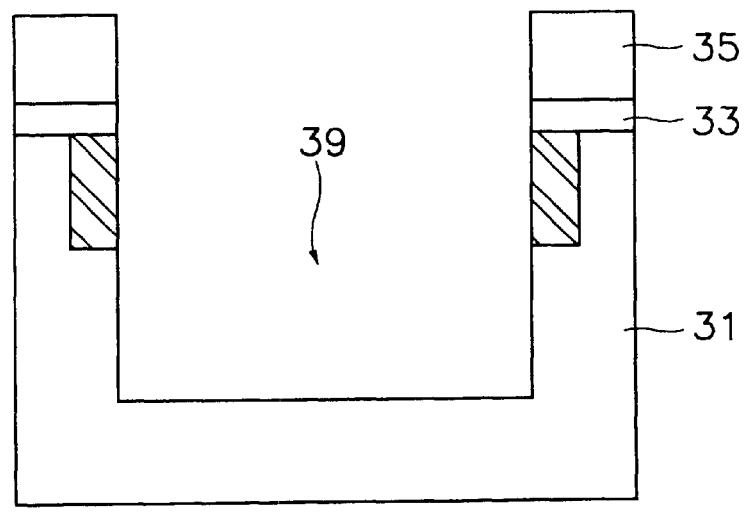

As shown in FIG. 4b, a predetermined thickness of the semiconductor substrate 31 is etched using the stacked structure as a mask, thereby forming a trench 39.

Here, the impurity implantation region 37 is provided at the upper side walls of the trench 39, namely in the semiconductor substrate at the lower portions of the pad oxide film 33 and the pad nitride film 35.

Figure 4C:
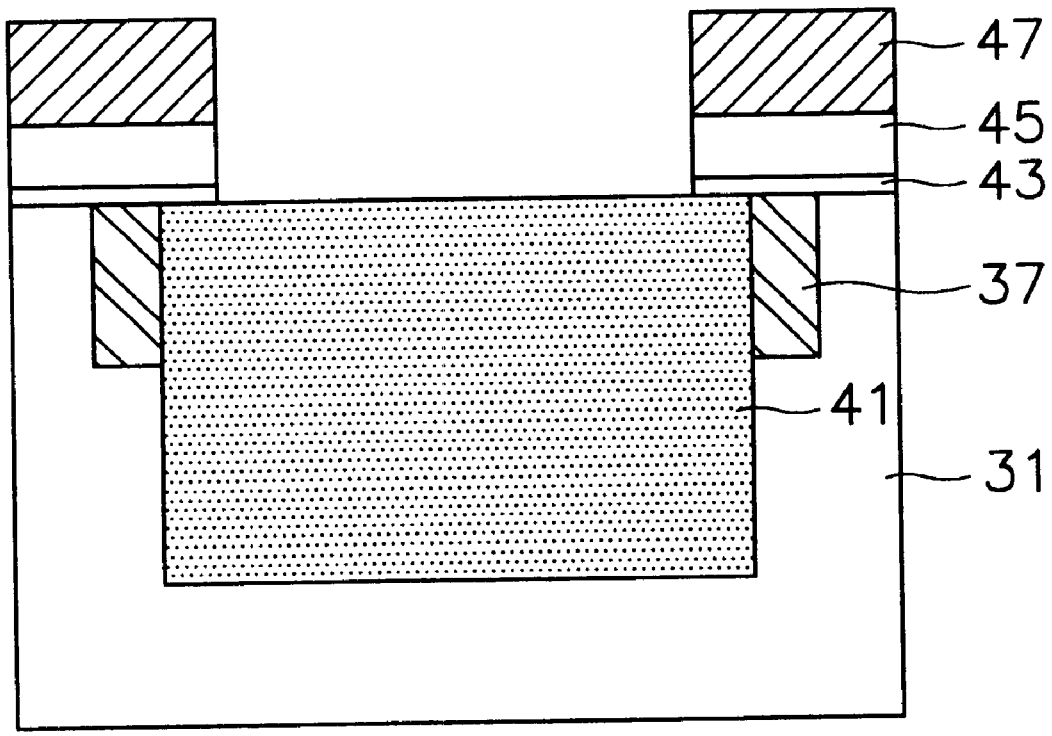

As depicted in FIG. 4c, a trench filling oxide film is formed over the entire structure, and then planarized. Thereafter, a trench type device isolation film 41 is formed by removing the pad nitride film 35 and the pad oxide film 33.

A well (not shown) is formed on the semiconductor substrate 31 according to the ion implantation process.

A gate oxide film 43 is then formed on the surface of both the semiconductor substrate 31 and the device isolation film 41.

A gate electrode conductive layer is stacked on the gate oxide film 43. A gate electrode is formed by patterning the resultant structure.

Here, the gate electrode conductive layer may have a stacked structure having both doped polysilicon 45 and tungsten silicide 47 layers.

The impurity ion implantation region 37 is provided at the channel region of the gate electrode.

The impurity ion implantation region 37 compensates for reductions in the threshold voltage of the transistor resulting from movement of the impurity ions from channel region toward to the trench. Accordingly, the leakage current is decreased, and a parasitic transistor at the sidewalls is turned on with the transistor at the active region, thereby overcoming the hump phenomenon.

As discussed earlier, in accordance with the present invention, the method for forming the device isolation film for the semiconductor device restricts the inverse narrow width effect by maintaining or increasing the threshold voltage of the transistor, prevents reduction in the threshold voltage caused by the impurity in the channel region moving toward to the trench, decreases the leakage current, and overcomes the hump phenomenon by turning on the parasitic transistor at the sidewalls with the transistor in the active region. As a result, the properties and reliability of the semiconductor device are improved.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalencies of such metes and bounds are therefore intended to be embraced by the appended claims.

What is claimed is:

1. A method for forming a device isolation film for a semiconductor device, comprising:

sequentially forming a pad oxide film and a pad nitride film on a semiconductor substrate;

forming a pad oxide film pattern and a pad nitride film pattern, by patterning the pad oxide film and the pad nitride film using a device isolation mask;

forming an impurity implantation region by ion-implanting an impurity into the semiconductor substrate using the pad nitride film pattern as a mask;

performing a thermal treatment to diffuse the impurity into the semiconductor substrate;

forming a trench by etching the semiconductor substrate using the pad nitride film pattern as a mask, a remaining portion of the impurity implantation region being provided at sidewalls of the trench;

forming a device isolation film filling the trench, and removing the pad nitride film pattern and the pad oxide film pattern; and forming a gate electrode on the device isolation film and active region, the impurity implantation region being provided at the lower portion of the gate electrode.

2. The method according to claim 1, wherein the impurity is an p-type impurity.

3. The method according to claim 2, wherein the impurity is boron.

4. The method according to claim 1, wherein the impurity is an n-type impurity.

5. The method according to claim 4, wherein the impurity is arsenic.

6. The method according to claim 1, wherein the impurity ion implantation process is performed at an energy of 10 to 100 KeV.

* * * * *